US009927467B2

(12) United States Patent
Chen et al.

(10) Patent No.: US 9,927,467 B2
(45) Date of Patent: Mar. 27, 2018

(54) ESTIMATING ENERGY SAVINGS FROM BUILDING MANAGEMENT SYSTEM POINT LISTS

(71) Applicant: International Business Machines Corporation, Armonk, NY (US)

(72) Inventors: Bei Chen, Dublin (IE); Joern Ploennigs, Dublin (IE); Anika Schumann, Dublin (IE); Olivier Verscheure, Toulouse (FR)

(73) Assignee: International Business Machines Corporation, Armonk, NY (US)

( * ) Notice: Subject to any disclaimer, the term of this patent is extended or adjusted under 35 U.S.C. 154(b) by 711 days.

(21) Appl. No.: 14/513,572

(22) Filed: Oct. 14, 2014

(65) Prior Publication Data

US 2016/0103160 A1    Apr. 14, 2016

(51) Int. Cl.
  *G05B 15/02*    (2006.01)
  *G01R 21/00*    (2006.01)
  *G05F 1/66*    (2006.01)

(52) U.S. Cl.
  CPC .............. *G01R 21/00* (2013.01); *G05B 15/02* (2013.01); *G05F 1/66* (2013.01)

(58) Field of Classification Search
  None
  See application file for complete search history.

(56) References Cited

U.S. PATENT DOCUMENTS

| 5,717,609 | A | * | 2/1998 | Packa | G01K 17/06 |
| | | | | | 374/E17.007 |
| 5,924,486 | A | | 7/1999 | Ehlers et al. | |
| 6,216,956 | B1 | | 4/2001 | Ehlers et al. | |
| 6,785,592 | B1 | * | 8/2004 | Smith | G06Q 50/06 |
| | | | | | 700/291 |

(Continued)

FOREIGN PATENT DOCUMENTS

WO    2009039500 A1    3/2009

OTHER PUBLICATIONS

Doukas et al., "Assessing energy-saving measures in buildings through an intelligent decision support model", Elsevier, Building and Environment 44, (2009), pp. 290-298, doi:10.1016/j.buildenv. 2008.03.006.

(Continued)

*Primary Examiner* — Isaac T Tecklu
(74) *Attorney, Agent, or Firm* — William H. Hartwell

(57) ABSTRACT

Software that uses actual, historic building management system (BMS) data and/or machine logic to estimate an amount of energy that would have been consumed (and saved) had the BMS been operated under the control of an energy management system (EMS). The software performs the following steps: (i) receiving first actual BMS information relating to operation of a first set of appliance(s) located in a first building during a first time interval; (ii) selecting a first proposed EMS rule set; and (iii) determining a first contrafactual energy resource use value based, at least in part, on the first actual BMS information, with the first (Continued)

contrafactual use value corresponding to an amount of energy resources that would have been consumed by the first set of appliance(s) if the BMS had operated the first set of appliance(s) under control of the first proposed EMS rule set.

14 Claims, 8 Drawing Sheets

(56) References Cited

U.S. PATENT DOCUMENTS

| | | | | |
|---|---|---|---|---|
| 7,451,017 | B2* | 11/2008 | McNally | G06Q 50/06 700/275 |
| 2011/0153103 | A1 | 6/2011 | Brown et al. | |
| 2012/0150707 | A1* | 6/2012 | Campbell | G06Q 30/04 705/34 |
| 2012/0221718 | A1* | 8/2012 | Imes | H04L 67/42 709/224 |
| 2012/0232701 | A1* | 9/2012 | Carty | G05B 15/02 700/277 |
| 2013/0204402 | A1 | 8/2013 | Mezic et al. | |
| 2014/0052304 | A1 | 2/2014 | Vuppala et al. | |
| 2014/0163750 | A1 | 6/2014 | Brady et al. | |
| 2014/0163753 | A1* | 6/2014 | Brady | G06Q 50/06 700/286 |
| 2014/0236373 | A1* | 8/2014 | Lee | H02J 4/00 700/295 |
| 2015/0227870 | A1* | 8/2015 | Noboa | G06Q 10/0635 705/7.28 |

OTHER PUBLICATIONS

Kolokotsa et al., "Decision support methodologies on the energy efficiency and energy management in buildings", Chapter 5, May 8, 2009, pp. 121-146, Advances in Building Energy Research, vol. 3, earthscan, publishing for a sustainable future, doi:10.3763/aber. 2009.0305.

Ploennings, et al., "Exploiting Generalized Additive Models for Diagnosing Abnormal Energy Use in Buildings", Buildsys'13, Nov. 13-14, 2013, Roma, Italy, Copyright © 2013 ACM 978-1-4503-2431-Jan. 13, 2011.

Wicaksono et al., "An Intelligent System for Improving Energy Efficiency in Building Using Ontology and Building Automation Systems", FZI Research Centre for Information Technology, Germany, Chapter 27, pp. 531-548, DOI: 10.5772/48006, "Automation", book edited by Florian Kongoli, ISBN 978-953-51-0685-2, Published: Jul. 25, 2012 under CC BY 3.0 license.

* cited by examiner

| No | POINT LIST | TIME SERIES VALUE AT TIME STAMP | | | | | | | | | |
|---|---|---|---|---|---|---|---|---|---|---|---|
| | | 1 | 2 | 3 | 4 | 5 | 6 | 7 | 8 | 9 | 10 |
| 1 | L1_Temperature | 20.3 | 20.6 | 20.9 | 21.1 | 21.2 | 21.1 | 20.8 | 20.7 | 20.3 | 20.0 |
| 2 | L1_AC1_CoolingSetpoint | 21.0 | 21.0 | 21.0 | 21.0 | 21.0 | 21.0 | 21.0 | 21.0 | 21.0 | 0.0 |
| 3 | L1_AC1_CoolingActuator | 0.0 | 0.0 | 0.0 | 0.5 | 1.0 | 1.0 | 1.0 | 1.0 | 1.0 | 1.0 |
| 4 | L1_AC1_EnergyMeter | 0.0 | 0.0 | 0.0 | 10.0 | 10.0 | 10.0 | 10.0 | 10.0 | 10.0 | 10.0 |
| 5 | L2_Temperature | 20.3 | 20.6 | 20.9 | 21.1 | 21.2 | 21.3 | 21.2 | 21.0 | 20.6 | 21.0 |
| 6 | L2_AC2_CoolingSetpoint | 21.0 | 21.0 | 21.0 | 21.0 | 21.0 | 21.0 | 21.0 | 21.0 | 21.0 | 21.0 |
| 7 | L2_AC2_EnergyMeter | 0.0 | 0.0 | 0.0 | 10.0 | 10.0 | 10.0 | 10.0 | 0.0 | 0.0 | 10.0 |

1000

| No | POINT LIST | LOCATION | | ASSET | | DATA POINT |
|---|---|---|---|---|---|---|
| | | ID | TYPE | ID | TYPE | TYPE |
| 1 | L1_Temperature | L1 | Room | - | AC | Temperature |
| 2 | L1_AC1_CoolingSetpoint | L1 | Room | AC1 | AC | CoolingSetpoint |
| 3 | L1_AC1_CoolingActuator | L1 | Room | AC1 | AC | CoolingActuator |
| 4 | L1_AC1_EnergyMeter | L1 | Room | AC1 | AC | EnergyMeter |
| 5 | L2_Temperature | L2 | Room | - | AC | Temperature |
| 6 | L2_AC2_CoolingSetpoint | L2 | Room | AC2 | AC | CoolingSetpoint |
| 7 | L2_AC2_EnergyMeter | L2 | Room | AC2 | AC | EnergyMeter |

| No | POINT LIST | EMSR1 | | | EMSR2 | | |
|---|---|---|---|---|---|---|---|
| | | Room.AC.CoolingAct. | Room.Temp. | Room.AC.CoolingSP | Room.AC.HeatingAct. | Room.Temp. | Room.AC.HeatingSP |
| 1 | L1_Temperature | | x | | | | |
| 2 | L1_AC1_CoolingSetpoint | | | x | | | |
| 3 | L1_AC1_CoolingActuator | x | | | | | |
| 4 | L1_AC1_EnergyMeter | | | | | | |
| 5 | L2_Temperature | | x | | | x | |
| 6 | L2_AC2_CoolingSetpoint | | | x | | | |
| 7 | L2_AC2_EnergyMeter | | | | | | |

FIG. 11

ESTIMATING ENERGY SAVINGS FROM BUILDING MANAGEMENT SYSTEM POINT LISTS

BACKGROUND OF THE INVENTION

The present invention relates generally to the field of building management systems and building energy management systems.

Building Management Systems (BMS) are known. A BMS is a computer-based control system installed in a building (or multiple buildings) that controls and monitors the building's mechanical and electrical equipment, such as heating, cooling, ventilation, lighting, shading, power systems, fire systems, and security systems. A BMS typically includes both hardware and software, and collects both historic and real-time interval data, with intervals varying from quarterly billing statements to minute-by-minute smart meter readings.

Many building management systems are supported by Energy Management Systems (EMS). An EMS is a system of computer-aided tools used to monitor, control, and optimize the performance of the BMS. EMS often provide tools for reducing energy costs and consumption for buildings (or communities). Examples of typical EMS functions include verifying energy data, benchmarking, setting high-level energy use reduction targets, trend analysis, tracking energy consumption, and identifying cost-saving opportunities. Additionally, many EMS provide engagement-related features such as real-time responses (automated or manual), initiation of a dialog between occupants and building managers to promote energy conservation, and displaying real-time energy consumption via web applications and/or onsite energy displays.

SUMMARY

According to an aspect of the present invention, there is a method, computer program product and/or system that performs the following steps (not necessarily in the following order): (i) receiving first actual building management system (BMS) information relating to operation of a first set of appliance(s) located in a first building during a first time interval; (ii) selecting a first proposed energy management system (EMS) rule set; and (iii) determining a first contrafactual energy resource use value based, at least in part, on the first actual BMS information, with the first contrafactual use value corresponding to an amount of energy resources that would have been consumed by the first set of appliance(s) if the BMS had operated the first set of appliance(s) under control of the first proposed EMS rule set.

BRIEF DESCRIPTION OF THE DRAWINGS

FIG. 10 is a table view showing information that is generated by embodiments of the present invention; and FIG. 11 is a table view showing information that is generated by embodiments of the present invention.

DETAILED DESCRIPTION

Figure 1:
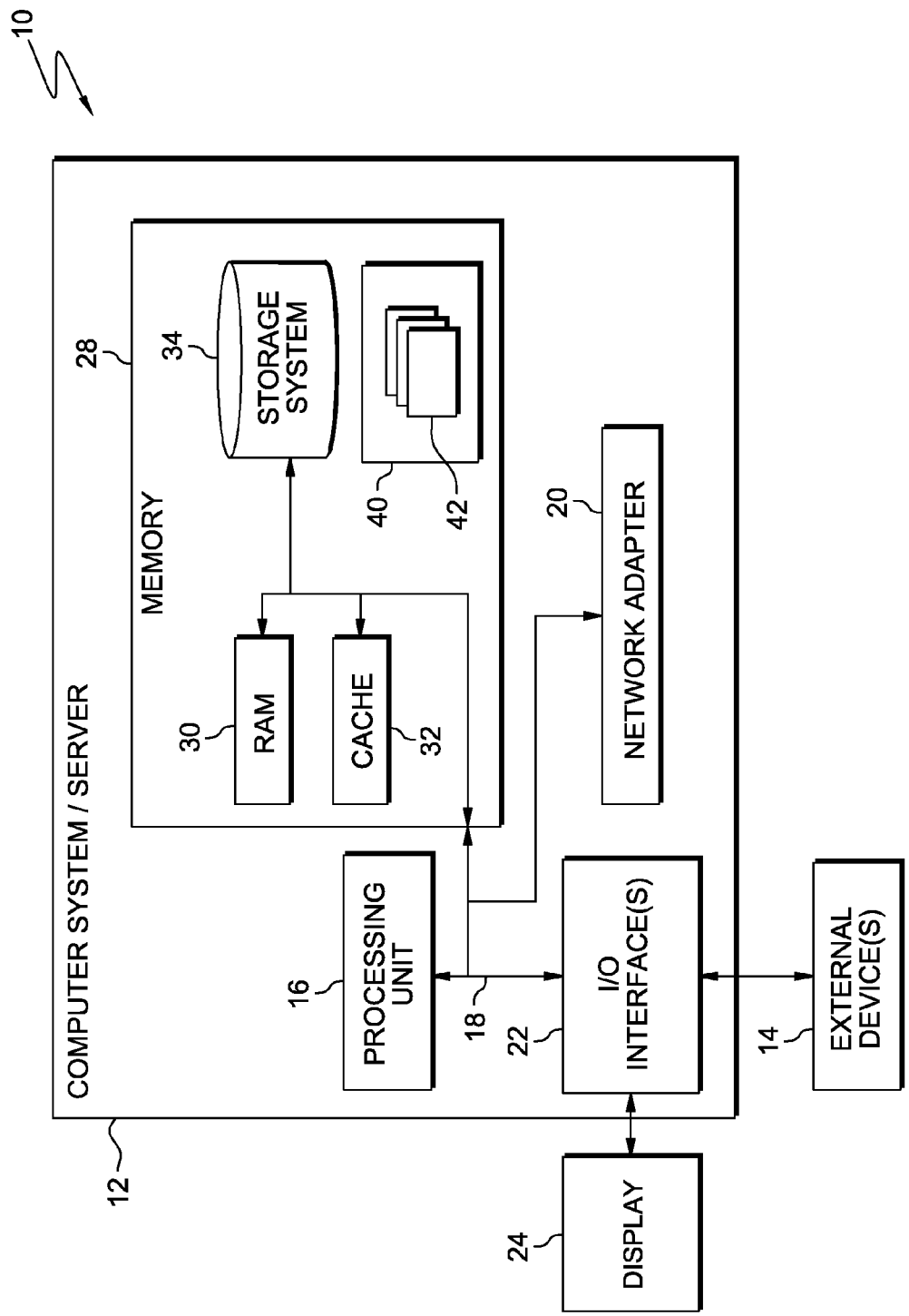
FIG. 1 depicts a cloud computing node used in a first embodiment of a system according to the present invention.

Energy management systems (EMS) are typically designed to monitor, control, and optimize the performance of building management systems (BMS). Some embodiments of the present invention use actual, historic BMS data and/or machine-logic to estimate an amount of energy that would have been consumed (and saved) had the BMS been operated under the control of an EMS. This Detailed Description section is divided into the following sub-sections: (i) The Hardware and Software Environment; (ii) Example Embodiment; (iii) Further Comments and/or Embodiments; and (iv) Definitions.

I. The Hardware and Software Environment

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

Figure 2:
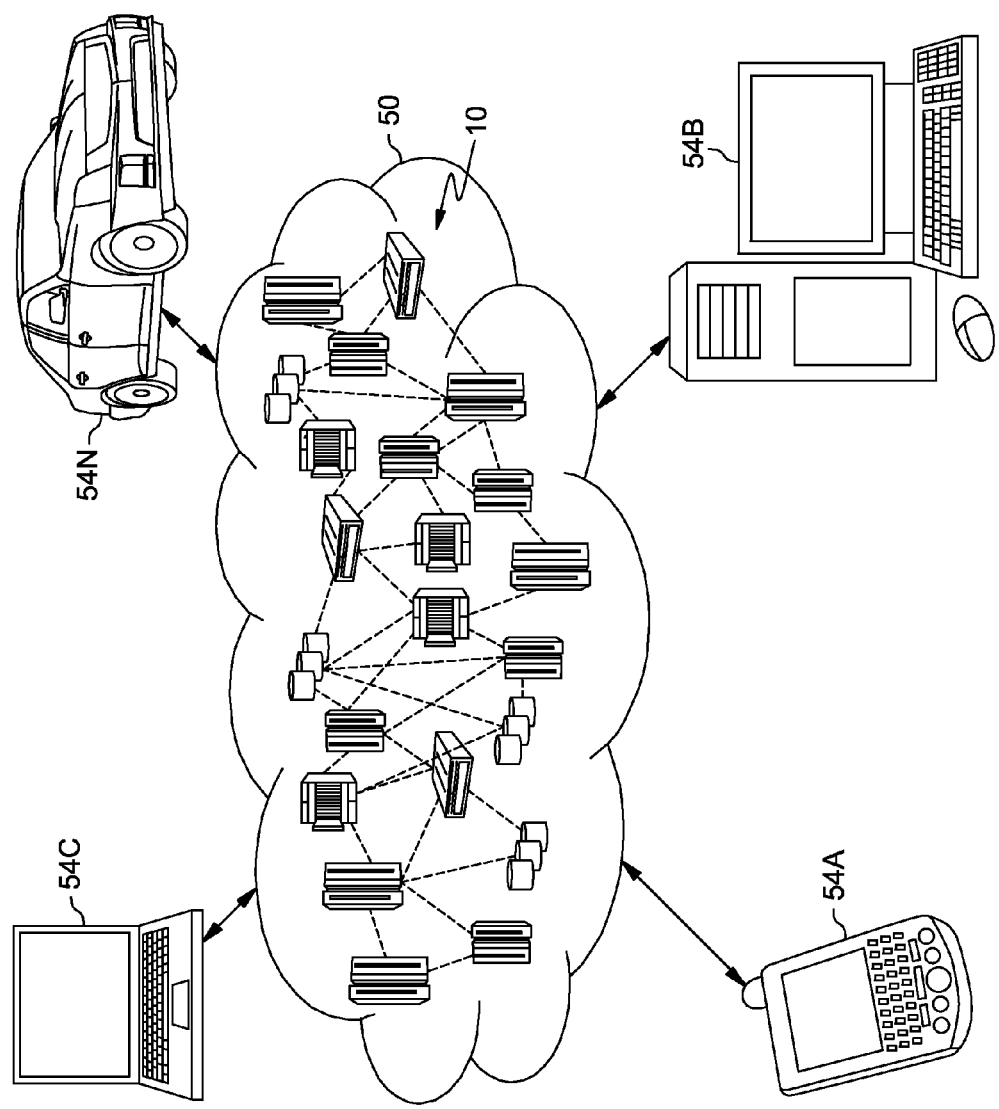
FIG. 2 depicts an embodiment of a cloud computing environment (also called the "first embodiment system") according to the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
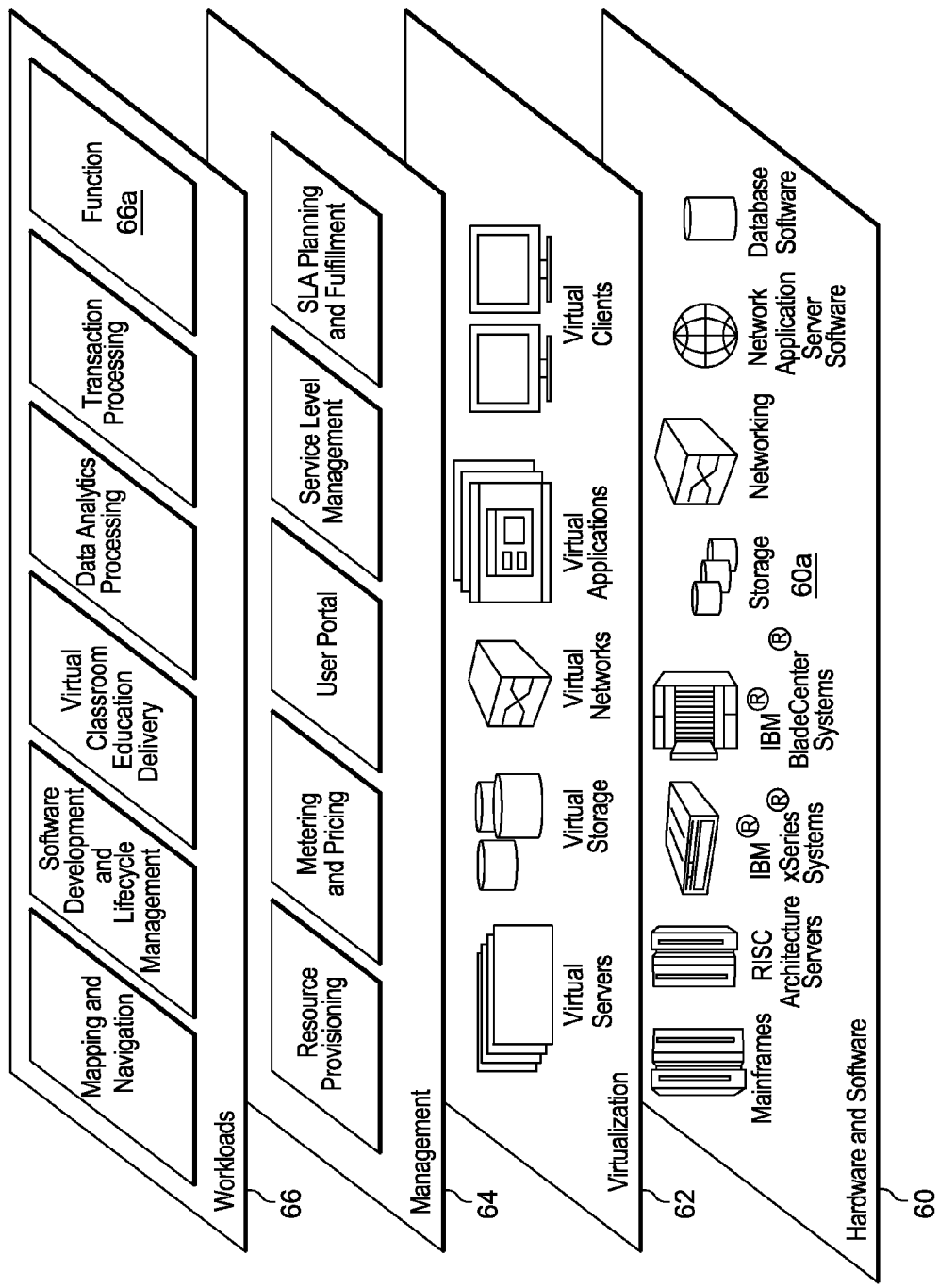
FIG. 3 depicts abstraction model layers used in the first embodiment system.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer 62 provides an abstraction layer from which the following examples of virtual entities may be provided: virtual servers; virtual storage; virtual networks, including virtual private networks; virtual applications and operating systems; and virtual clients.

In one example, management layer 64 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 66 provides examples of functionality for which the cloud computing environment may be utilized. Examples of workloads and functions which may be provided from this layer include: mapping and navigation; software development and lifecycle management; virtual classroom education delivery; data analytics processing; transaction processing; and functionality according to the present invention (see function block 66a) as will be discussed in detail, below, in the following sub-sections of this Detailed description section.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

II. Example Embodiment

Figure 4A:
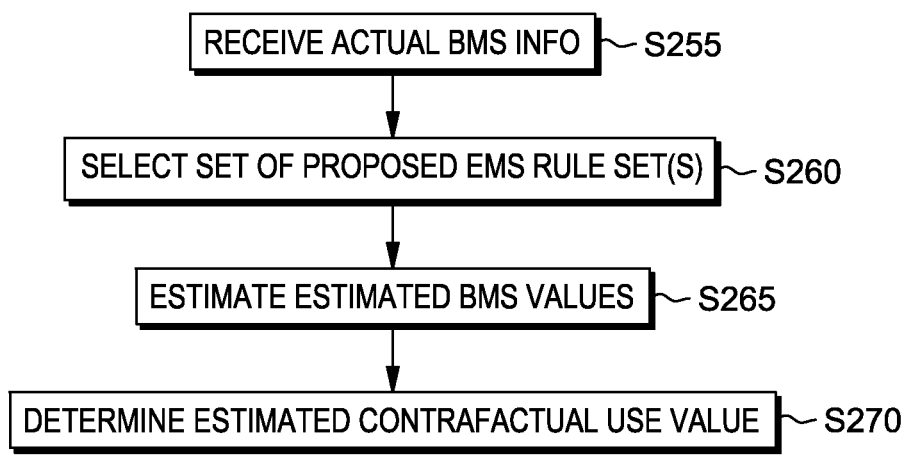
FIG. 4A is a flowchart showing a first embodiment method performed, at least in part, by the first embodiment system.
Figure 4B:
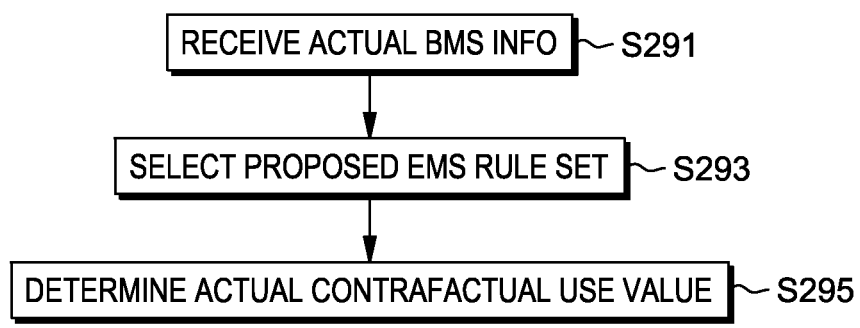
FIG. 4B is a flowchart showing a second embodiment method performed, at least in part, by the first embodiment system.
Figure 5:
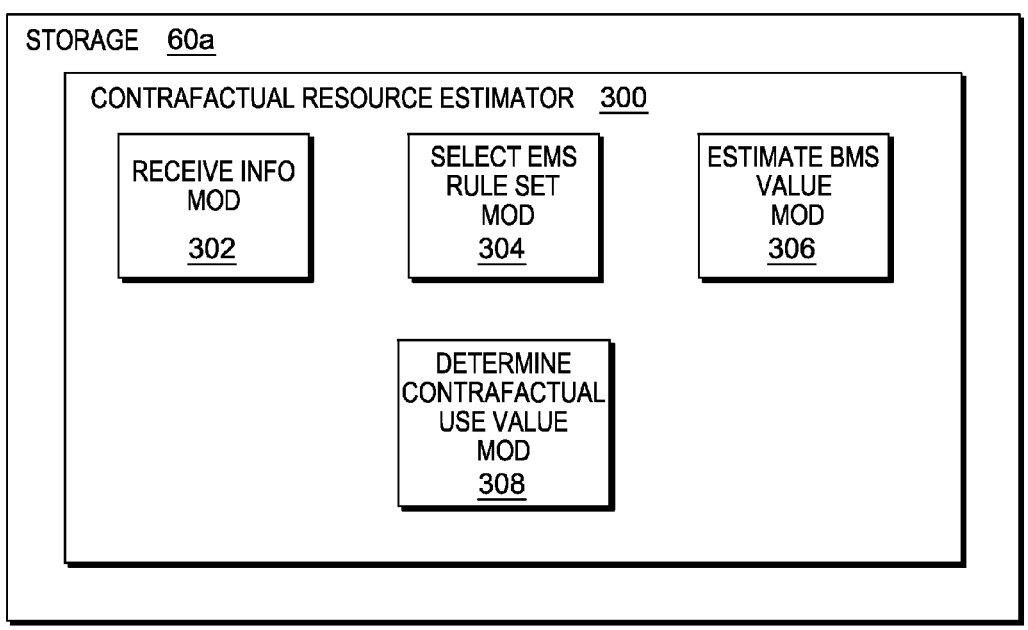
FIG. 5 is a block diagram view of a machine logic (for example, software) portion of the first embodiment system.

FIGS. 4A and 4B show flowcharts 250 and 290, respectively, depicting methods according to the present invention. FIG. 5 shows contrafactual resource estimator 300 for performing at least some of the method steps of flowchart 250 and/or flowchart 290. These methods and associated software will now be discussed, over the course of the following paragraphs, with extensive reference to FIGS. 4A/4B (for the method step blocks) and FIG. 5 (for the software blocks). As shown in FIG. 5, one physical location where contrafactual resource estimator 300 may be stored is in storage block 60a (see FIG. 3).

Contrafactual resource estimator (CRE) 300 is a program and/or system able to estimate how much energy an energy management system (EMS) may save in certain situations under certain conditions if it is installed. Although CRE 300 may be configured to integrate with a specific building management system (BMS), it is not necessarily required to. Furthermore, although CRE 300 of the present embodiment can perform all of the steps of method 250 and method 290, CRE 300 of other embodiments might not be so configured. In other embodiments (such as embodiments discussed in the Further Comments and/or Embodiments sub-section of this Detailed Description), method 250 and method 290 may be performed by other parts of system 12 (see FIG. 1). In those embodiments, the purpose of CRE 300 may be limited to proposing EMS rule set(s) for use by methods 250 and 290. For a further discussion of energy management systems (EMS) and EMS rules, see: (i) the Further Comments and/or Embodiments sub-section of this Detailed Description; and (ii) the Definitions sub-section of this Detailed Description.

A simplified example embodiment is provided herein for the purpose of explaining methods 250 (see FIG. 4A) and 290 (see FIG. 4B). In this example embodiment (referred to in this sub-section as the "present embodiment," the "example embodiment," and the "present example embodiment"), a simplified building is provided with one room and one appliance: a light. In this embodiment, the light is turned "on" for most of the day, while the room is in use. At the end of the day, at approximately 9:00 PM, a security guard locks the building and turns the light "off". However, because the room is not always occupied, energy resources associated with powering the light are not optimized; energy is wasted when the lights are "on" in an empty room.

Referring to FIG. 4A, processing begins at step S255, where receive info module ("mod") 302 receives actual building management system (BMS) information from a BMS (see FIG. 4A). The actual BMS information (also referred to as "actual BMS info" and/or "actual BMS values") relates to the operation of a set of appliance(s) located in a building during a historic or present time interval. Some examples of typical appliances and their corresponding BMS information include: (i) lights (on/off status, energy consumption); (ii) heaters/coolers (on/off status, room temperature, energy consumption); and (iii) electronically operated doors (locked/unlocked status, usage information, energy consumption). For more information on appliances, buildings, and BMS (including BMS info), see the Definitions sub-section of this Detailed Description.

In some embodiments of the present invention, the actual BMS info includes a point list with time series information, where the point list contains data points representing appliance information at specific points in time. For a further discussion of BMS time series information, see the Further Comments and/or Embodiments sub-section of this Detailed Description.

In the present example embodiment, as described above, the building includes one room with one appliance: a light. The BMS controls the light via a light actuator and collects information regarding the status of the light. As such, the actual BMS info received by mod 302 in this embodiment includes data points indicating whether the light is "on" or "off" at specific times.

Processing proceeds to step S260 (see FIG. 4A), where select EMS rule set mod 304 (see FIG. 5) selects a set of proposed EMS rule set(s) from CRE 300. In many embodiments of the present invention, the proposed EMS rules contained in the set of proposed EMS rule set(s) (which are typically stored in CRE 300) are used to identify potential energy savings in the operation of the BMS. Generally speaking, many EMS rules use BMS information (such as the actual BMS info received in step S255) as input. For a further discussion of energy management systems (EMS) and EMS rules, see: (i) the Further Comments and/or Embodiments sub-section of this Detailed Description; and (ii) the Definitions sub-section of this Detailed Description.

In many embodiments of the present invention, the selection of EMS rules in step S260 is an automated process based on a wide variety of possible criteria. In some embodiments of the present invention, the proposed EMS rules are selected by mod 304 based, at least in part, on the proposed EMS rules' compatibility with the BMS. In one embodiment, the EMS rules may be selected because the actual BMS info received in step S255 is sufficient input for the EMS rules. In another embodiment, the EMS rules may be selected based on their ability to provide recommended BMS equipment additions that can further increase energy savings. For further examples and discussion of selecting EMS rules, see the Further Comments and/or Embodiments sub-section of this Detailed Description.

In the present example embodiment, the set of proposed EMS rule set(s) includes two proposed EMS rule sets, each with a single rule. The first proposed EMS rule (of the first proposed EMS rule set) turns the light off at 6:00 PM. The second proposed EMS rule (of the second proposed EMS rule set) turns off the light based on a motion sensor. Both rules are meant to increase energy savings by turning off the light at times when it is likely that no occupants are in the room. However, while the first proposed EMS rule is ready to be implemented by the BMS, the second proposed EMS rule requires additional BMS equipment (specifically, a motion sensor).

Processing proceeds to step S265, where estimate BMS value mod 306 estimates estimated BMS values that are needed to calculate the potential energy savings provided by each selected EMS rule. Stated another way, in many embodiments of the present invention, the received (actual) BMS info may not provide enough information to adequately calculate potential energy savings; as such, it is necessary to estimate additional BMS values to provide the desired information. In many embodiments, the estimation is performed by a machine-logic-based knowledge base that uses factors such as the following: historical data for the building, historical data for other buildings, computer simulations of building behavior, physics-related mathematical equations, statistics-related mathematical equations, observational data, and/or pre-programmed knowledge (such as information provided by experts, standards, regulations, and/or appliance product manuals). In some embodiments of the present invention (discussed below), no estimated BMS values are needed because sufficient BMS information was received in step S255. However, in many embodiments (including the present example embodiment), estimated BMS values are needed. In some embodiments, for example, estimated BMS values are needed for rules that require BMS equipment (or "add-ons") that could be installed in the building, but has not yet been installed in the building. For further examples and/or discussion of estimating BMS values, see the Further Comments and/or Embodiments sub-section of this Detailed Description.

As discussed above, the first proposed EMS rule (also called the "first rule" or "first EMS rule") of the present example embodiment turns the light off at 6:00 PM. In order to calculate the estimated energy savings that this rule could provide, CRE 300 (see FIG. 5) needs to determine how much additional time the light would have been off if the rule had been in place. Although CRE 300 has actual BMS info relating to the on/off status of the light at given times, it has no information about the room's usage. Specifically, CRE 300 does not have information regarding the room's occupancy after 6:00 PM. If the room is always vacated by 6:00 PM, then the first proposed EMS rule should always result in energy savings. However, if the room is sometimes occupied at 6:00 PM, whoever is occupying the room would (theoretically, at least) turn the light back on, thus eliminating the energy savings provided by the rule. Therefore, CRE 300 must estimate the room's occupancy status. To do this, CRE 300 (and estimate BMS value mod 306) uses the knowledge base to determine how often the room would be occupied at 6:00 PM, when the first rule would turn off the light. Some factors that CRE 300 may consider include, for example: actual BMS data from other, similar buildings; statistical models; typical workday hours; and/or typical weekend/holiday usage. Using this information, CRE 300 determines that the room would have been occupied at 6:00 PM half (50%) of the time. As a result, CRE 300 has enough data to estimate energy savings for the first proposed EMS rule.

The second EMS rule, as discussed above, turns the light off based on a motion sensor. Specifically, this rule turns off the light when the motion sensor detects that no people are in the room. However, as with the first rule, in order to estimate the energy savings that this rule would provide, information on room usage is needed. As such, CRE 300 uses the machine-logic-based knowledge base to determine how often the room would be occupied during the time interval. It should be noted that this determination is different than the determination discussed in the previous paragraph. In the previous discussion of the first rule, the determination was limited to building occupancy at 6:00 PM (due to the requirements/limitations of the first rule); for the second rule, however, building occupancy between the hours of 6:00 PM and 9:00 PM must be determined. In this present example, CRE 300 determines that, between the hours of 6:00 PM and 9:00 PM, the room would have been occupied 20% of the time. CRE 300 makes this determination based on a number of factors, such as the following: average work patterns; actual BMS data from other, similar buildings; typical workday hours; typical lunchtime hours; and/or typical weekend/holiday usage.

Upon estimating the estimated BMS values for each proposed EMS rule, processing then proceeds to step S270, where determine contrafactual use value mod 308 determines an estimated contrafactual use value for the set of proposed EMS rule set(s). The estimated contrafactual use value corresponds to an amount of energy resources that would have been consumed by the building if the BMS had operated the building under control of the CRE 300. In this step, CRE 300 uses the actual BMS info obtained in step S255 and the estimated BMS info obtained in step S265 and applies them to the proposed EMS rules selected in step S260. Utilizing additional energy and cost quantifying information contained in the actual BMS values, the estimated BMS values, and/or the knowledge base, CRE 300 (and mod 308) then calculates the estimated contrafactual use value. In some embodiments (including the present example embodiment), an estimated contrafactual use value is calculated for each proposed EMS rule. However, in other embodiments, a joint contrafactual use value may be used, either on its own or in combination with separate contrafactual use values for each proposed EMS rule. Additional details and/or discussion regarding the calculation of contrafactual use values can be found in the Further Comments and/or Embodiments sub-section of this Detailed Description.

In many embodiments of the present invention, mod 308 (in step S270) further estimates how much energy would have been saved had the set of proposed EMS rule set(s) been implemented during the time interval. To do this, mod 308 determines how much energy was actually used during the time interval and compares it to the contrafactual use value. As such, in many embodiments of the present invention, CRE 300 receives an actual energy use value corresponding to the energy actually used by the building during the time interval. The actual energy use value is typically available from the actual BMS info or via other readily available means.

In the present example embodiment, in step S270 CRE 300 begins by calculating the total amount of energy consumed by the lights over the time interval (the actual energy use value), using the BMS values obtained in step S255. For simplification purposes, the time interval for the present example embodiment is limited to between 6:00 PM and 9:00 PM. In this example embodiment, 100 kilowatts (KW) were consumed during the time interval, where the lights were on from 6:00 PM to 9:00 PM every day.

Next, CRE 300 determines how much energy would have been consumed had the first proposed EMS rule been used. According to the estimated BMS values, the first proposed EMS rule would have resulted in the lights being "off" 50% of the time between 6:00 PM and 9:00 PM. As such, if the first proposed EMS rule had been used, only 50 kW would have been consumed, resulting in 50% energy savings (and a first estimated contrafactual use value of 50 kW).

Next, CRE 300 determines how much energy would have been consumed had the second proposed EMS rule been used. According to the estimated BMS values, the second proposed EMS rule would have resulted in the lights being "off" 80% of the time between 6:00 PM and 9:00 PM (for this simplified example, it is assumed that motion sensors would have turned out the lights as soon as the room was vacated). As such, if the second proposed EMS rule had been used, only 20 kW would have been consumed, resulting in 80% energy savings (and a second estimated contrafactual use value of 20 kW).

Upon completion of method 250, the estimated contrafactual use value(s) (or the difference between the estimated contrafactual use value(s) and the actual energy use value) may be communicated to a user, such as a potential customer of BMS and/or EMS products. In many embodiments of the present invention, the purpose of the communication may be to help the user with a purchasing decision (for example, whether to purchase an EMS, an EMS add-on, or a BMS add-on). In the present embodiment, for example, the first estimated contrafactual use value may be used to show the user the benefits of purchasing an EMS, as the first estimated contrafactual use value shows how much energy could have been saved by using the EMS. Furthermore, the second estimated contrafactual use value may be used to show the user the additional benefits of purchasing motion sensors (additional BMS equipment) in addition to the EMS, as the energy savings provided by the second rule would not be available unless motion sensors were added to the BMS. The estimated contrafactual use values may be presented to the user (or "expressed") in the form of energy units (such as kW, m3, 1), percentage of energy saved, carbon credits, and/or the amount of money saved. Furthermore, estimated contrafactual use values may be presented for each individual BMS system. For example, estimated contrafactual use values may be presented for the lighting systems in each individual room in a building, as each room may have a different occupancy profile and thus invoke different energy savings. The estimated contrafactual use values may also be joined on a higher abstraction level, such as all savings for all lighting systems. In these embodiments, the user can view information at all abstraction levels to further understand and justify where savings are coming from.

Referring now to FIG. 4B, method 290 is another method of the present invention adapted to determine contrafactual use value(s) for a proposed EMS rule set. However, as opposed to method 250, which uses estimated BMS values when some actual BMS values are not available, method 290 is used when no estimation is needed due to having a complete set of actual BMS values. Processing begins with step S291, where the receive info mod 302 (see FIG. 5) receives actual BMS info from the BMS. For more information on this step, see the discussion of step S255, above.

When using the same example embodiment as above, step S291 (see FIG. 4B) operates nearly identically to step S255 (see FIG. 4A). However, in the present example, one factor has changed: the building now contains a motion detector in its one room. As such, in addition to receiving on/off information from the light, CRE 300 also receives BMS information from the motion detector. Specifically, CRE 300 receives information about whether a room is occupied at a given time.

Processing proceeds to step S293, where the select EMS rule set mod 304 (see FIG. 5) selects a proposed EMS rule set (see FIG. 4B). Again, this step S293 operates in substantially the same manner as step S260 (see FIG. 4A), discussed above. In the present example embodiment, the second proposed EMS rule (the rule for turning off the lights based on a motion sensor, discussed above) is selected.

Processing then proceeds to step S295, where the determine contrafactual use value mod 308 (see FIG. 5) determines an actual contrafactual use value for the selected EMS rule set. Although this step S295 operates in substantially the same manner as step S270, it does so with one major difference: no estimated BMS values are used. In step S295, no estimated BMS values are needed because all of the needed BMS data has been provided in actual BMS values. As such, the resulting contrafactual use value is an actual contrafactual use value instead of an estimated contrafactual use value. The actual contrafactual use value represents the actual amount of energy that would have been saved (as opposed to an estimated amount of savings) had the EMS rule set been used to operate the BMS during the time interval.

Referring again to the present example embodiment, the BMS info obtained from the motion sensor in step S291 shows that the room was only occupied for 10% of the time between 6:00 PM and 9:00 PM during the time interval. As such, the energy savings for using the second EMS rule to operate the BMS would have been 90% (with an actual contrafactual use value of 10 kW).

Referring to the actual contrafactual use value of method 290 (see FIG. 4B) and the estimated contrafactual use value of method 250 (see FIG. 4A), it should be noted that although the actual contrafactual use value may be a more accurate calculation of energy that could have been saved (and therefore a helpful prediction of future savings), in some embodiments the actual contrafactual use value will convey less energy savings than the estimated contrafactual use value. The purpose of the contrafactual use values is not, in many embodiments, to represent the highest amount of potential savings; rather, the purpose is to convey a realistic estimate for potential savings. Furthermore, in some embodiments of the present invention, both actual and estimated contrafactual use values may be presented to the user, with the method used to determine the contrafactual use values displayed to the user. This helps to communicate the relative certainty of the respective contrafactual use values and the probability of predicting future energy savings, thereby providing the user with more helpful information to inform EMS and BMS purchasing decisions.

III. Further Comments and/or Embodiments

Some embodiments of the present invention recognize the following facts, potential problems and/or potential areas for improvement with respect to the current state of the art: (i) existing systems cannot predict energy savings until after an Energy Management System (EMS) is installed; (ii) some existing systems provide only rough savings estimates that are not justified by historical data; (iii) some existing systems require manual user input to predict energy savings; (iii) many existing systems are undesirable and/or incompatible with large EMS that cover several buildings; and/or (iv) many existing systems have inefficient installation processes (including mapping EMS functions to Building Management System (BMS) data) due, at least in part, to the inability to predict energy savings until after installation.

Some embodiments of the present invention may include one, or more, of the following features, characteristics and/or advantages: (i) automatically estimating energy savings on historical data without needing to configure and/or install an EMS; and/or (ii) automatically estimating energy savings on historical data without needing to manually input data.

Many embodiments of the present invention are adapted to: (i) capture, for each EMS, knowledge about energy savings that each EMS functionality will bring for a given time series data characteristic; (ii) use the knowledge to automatically quantify the expected energy savings the EMS installation will bring; and (iii) justify the expected energy savings by explaining how the expected energy savings were quantified and/or calculated. Furthermore, as discussed in detail below, many embodiments of the present invention are adapted to analyze the following: (i) applicable EMS energy-savings rules; (ii) EMS energy-savings rules that could be applicable by extending the functionality of a building management system (BMS); and/or (iii) the potential energy savings for both (i) and (ii).

Figure 6:
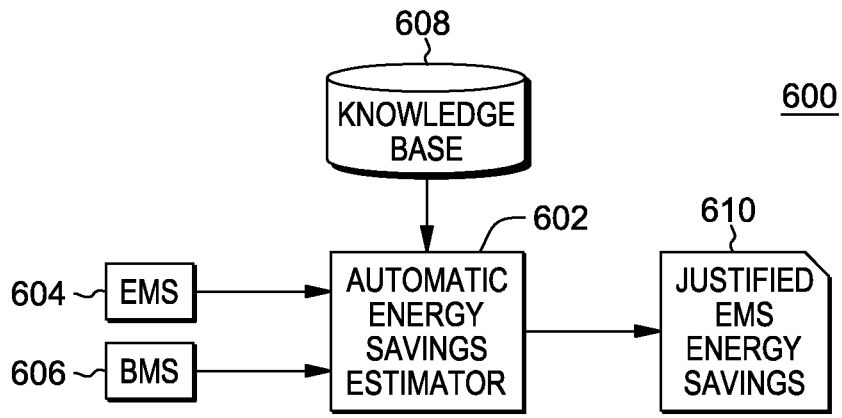
FIG. 6 is a block diagram view of a second embodiment of a system according to the present invention.

A system diagram of an embodiment 600 of the present invention is shown in FIG. 6. In this embodiment, automatic energy savings estimator (AESE) 602 receives the following input: (i) execution rules from EMS 604; and (ii) a point list with time series information from BMS 606. Upon receiving these inputs, AESE 602 utilizes subject matter information from knowledge base 608 to automatically select, parameterize, and execute building-specific analysis algorithms on the time series information from BMS 606. These algorithms (which may contain, for example, domain specific models, empiric models, predictive models, and/or simulative models) are adapted to compute justified EMS energy savings 610. The justified EMS energy savings 610 (also referred to as estimated/actual contrafactual use values) provide guidelines for how much energy can be saved using EMS 604 with the current point list (from BMS 606), as well as additional savings that could be achieved by adding additional measurement equipment to BMS 606.

Figure 7:
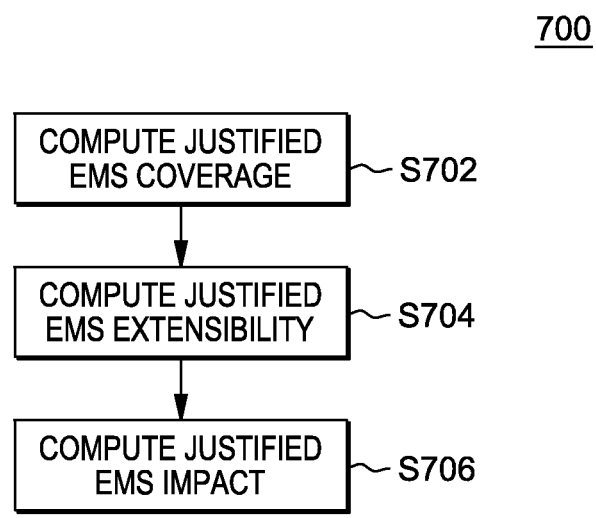
FIG. 7 is a flowchart showing a third embodiment method performed, at least in part, by the second embodiment system.

As stated above, in many embodiments of the present invention, AESE 602 (see FIG. 6) is adapted to compute a justified EMS energy savings 610 estimate for a given building (or set of buildings covered by BMS 606), using the building's existing time series data. A method 700 according to one of these embodiments is shown in FIG. 7. Processing begins with step S702, where AESE 602 (see FIG. 6) computes justified EMS 604 coverage information, such as the number of EMS 604 functions that are applicable for a particular building. Processing then proceeds to step S704, where justified extensibility information (such as an estimate of additional energy savings that could be obtained by adding additional data points and/or sensors) is computed. Finally, processing proceeds to step S706, where AESE 602 (see FIG. 6) computes justified EMS 604 impact information, such as an estimate of potential energy savings based on specific data from similar buildings and/or the current building.

Figures 8, 9:
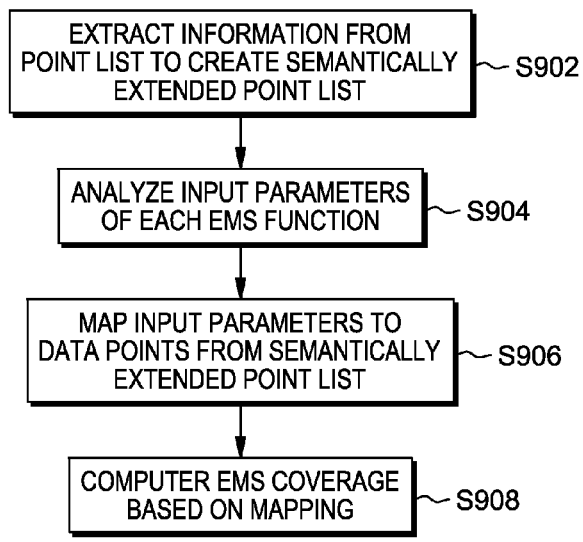
FIG. 8 is a table view showing information that is generated by embodiments of the present invention.
FIG. 9 is a flowchart showing a fourth embodiment method performed, at least in part, by the second embodiment system.

In one embodiment of the present invention, two air conditioning units AC1, AC2 are provided. AC1 is adapted to supply cool air to a room L1, while AC2 is adapted to supply cool air to a room L2. Each unit AC1, AC2 includes: (i) a cooling module, to cool air; (ii) a heating module, to heat air; and (iii) a fan, to ventilate air through the cooling and heating modules. Table 800 (see FIG. 8) shows an example point list with time series information for a number of data points relating to AC1, AC2, L1, and L2. This data serves as the output of BMS 606 (see FIG. 6) and is received by AESE 602.

Continuing with the present embodiment, EMS 604 (see FIG. 6) generates the following execution rules (also referred to as "proposed EMS rules") to detect energy wastage in AC1 and AC2:
   EMSR1: IF ((Room.AC.CoolingActuator>0) and (Room.Temperature<Room.AC.CoolingSetPoint)) THEN raise alarm
   EMSR2: IF ((Room.AC.HeatingActuator>0) and (Room.Temperature>Room.AC.HeatingSetPoint)) THEN raise alarm Rule EMSR1 raises an alarm when the cooling module is active despite the room temperature being lower than the cooling setpoint. EMSR2 detects the analogous situation for the heating module: EMSR2 raises an alarm when the heating module is active despite the room temperature being higher than the heating setpoint. In both cases, the rules identify energy wastage as situations where the respective modules are unnecessarily active.

Referring back to FIG. 7, the first step taken by the AESE 602 (see FIG. 6) is to compute the justified EMS 604 coverage (step S702). A method 900 for performing this computation is provided in FIG. 9. Processing begins with step S902, where the AESE 602 extracts a location ID, a location type, an asset ID, an asset type, and a data point type from the input point list to create a semantically extended point list (or "extended point list"). The semantically extended point list will assist the AESE 602 in automating the mapping of the data points retrieved from BMS 606 to rules EMSR1 and EMSR2 from EMS 604. Table 1000 (see FIG. 10) shows an example extended point list extracted during this step S902.

Processing proceeds to step S904, where input parameters of each EMS 604 function (EMSR1, EMSR2) are analyzed to determine whether the extended point list information can be used as inputs. In the present embodiment, for example, EMSR1 (see above) depends on the input parameters Room.AC.CoolingActuator, Room.Temperature, and Room.AC.CoolingSetPoint. Step S904 analyzes these parameters to determine whether any of the data from the semantically extended point list (see FIG. 10) can be matched to them.

Processing proceeds to step S906, where the AESE 602 maps the data points from the semantically extended point list to the input parameters of the EMS 604 functions. An example of this mapping can be seen in table 1100 (see FIG. 11). More specifically, in some embodiments of the present invention, the mapping is performed according to the following Algorithm 1 provided by the knowledge base 608 (see FIG. 6):

---
FOR EACH asset id 'aid' of type 'at' and its location id 'lid' of type 'lt' in point list 'PL' DO
   FOR EACH function type 'ft' in 'EMS' applicable to the asset type 'at' DO
      set 'NotMappedPoints=∅, 'MappedPoints=∅
      FOR EACH generic data point 'g' used in 'ft'
      DO search for all data points 'D' in point list 'PL' with the same asset type as 'at', location type as 'lt', and data point type as 'g'
         IF set 'D' is not empty
            THEN add tuple '(g, D)' to 'MappedPoints'
            ELSE add 'g' to 'NotMappedPoints'
         IF 'NotMappedPoints' is empty
            THEN add tuple '(ft, aid, at)' to 'CoveredFunctions'
            ELSE add tuple '(ft, aid, at)' to 'NotCoveredFunctions'
---

Algorithm 1 searches for each EMS 604 function that is applicable to an asset/location in BMS 606. For each EMS 604 function, the EMS 604 input parameters found in the point list (that is, the input parameters that are matched to BMS 606 data points) are added the set of MappedPoints. All input parameters that cannot be mapped are added to the set of NotMappedPoints. If all input parameters of a function could be successfully mapped (NotMappedPoints is empty), AESE 602 adds the function (including its function type, asset ID, and asset type) to a set of CoveredFunctions. Otherwise, AESE 602 adds the function to NotCoveredFunctions.

Referring still to the present embodiment, upon completing execution of Algorithm 1, the following BMS 606 data point to EMS 604 input parameter mappings for EMSR1 are identified: (i) L1_AC1_CoolingActuator to Room.AC.CoolingActuator; (ii) L1_AC1_CoolingSetpoint to Room.AC.CoolingSetPoint; and (iii) L1_Temperature to Room.Temperature. Because all input parameters for EMSR1 are mapped (that is, all input parameters correspond to actual BMS information), EMSR1 is added to the set of CoveredFunctions. However, when the mappings for EMSR2 are identified, no mappings are provided for input parameters Room.AC.HeatingActuator and Room.AC.HeatingSetPoint. As such, EMSR2 cannot be fully mapped and EMSR2 is added to the set of NotCoveredFunctions.

Processing then proceeds to step S908, where EMS 604 coverage is computed based on the mapping of EMS 604 functions. Coverage for EMS 604 can be defined and/or represented in a number of ways. The functional coverage of EMS 604, for example, defines how many of the applicable EMS 604 functions are being utilized by the BMS 606 data. Algorithm 2 is an algorithm of the present invention that calculates the functional coverage of EMS 604:

---
Compute 'FunctionalCoverScore = ||CoveredFunctions|| / (||CoveredFunctions|| + ||NotCoveredFunctions||)'
---

In the present embodiment, there is one successful mapping (AC1 to EMSR1) and three unsuccessful mappings (AC1 to EMSR2, AC2 to EMSR1, and AC2 to EMSR2). Therefore, the functional coverage score (or "FunctionalCoverScore") equals 25%. The functional coverage score provides the user a quantitative measure of how much of the EMS 604 functionality is covered. In addition to the functional coverage score, it is anticipated that a large variety of other coverage scores may be computed. For example, AESE 602 may compute coverage scores based on aspects such as asset coverage, data point coverage, and location coverage. Upon computing the EMS 604 coverage score, processing for method 900 completes.

Referring back to FIG. 7, the next step taken by the AESE 602 (see FIG. 6) upon computing the justified EMS 604 coverage is to compute the justified EMS 604 extensibility (step S704). Extensibility is a measure of how easily EMS 604 coverage can be improved. An extensibility score covers many different aspects. Functional extensibility, for example, is defined as a set of functions that are extensible (that is, functions that are not covered by BMS 606 but could be covered if additional sensors and/or data points were added). These sets of functions may be determined in a couple of different ways: (i) by utilizing implicit knowledge gained in step S702 (discussed above); and (ii) utilizing information contained in knowledge base 608 (see FIG. 6).

Algorithm 3 is a rule of the present invention (located in knowledge base 608) that evaluates the implicit knowledge gained in step S702:

```
FOR EACH tuple 't' in 'NotCoveredFunctions' DO
    IF function type 'ft' and asset type 'at' of tuple
    't' is same to any tuple in 'CoveredFunctions'
    THEN add 't' to 'ExtensibleFunctions'
```

With Algorithm 3, functions in the set of NotCoveredFunctions (see Algorithm 1, discussed above) are identified and added to the set ExtensibleFunctions if they could potentially be extended for coverage in the future. For example, in the present embodiment, AC2 was unable to be mapped to EMSR1 during step S702. However, because AC1 was able to be mapped to EMSR1, and AC1 and AC2 are of the same asset type (AC), Algorithm 3 determines that AC2 could potentially be mapped to EMSR1 in the future if additional data points were added. Therefore, AESE 602 adds AC2 to the set ExtensibleFunctions.

A second way of identifying extensible functions is by utilizing information contained in knowledge base 608 (see above). In the present embodiment, it is known from product documentation that assets of the type AC (air conditioners) are able to be applied to EMSR1 and EMSR2. Algorithm 4 is a rule of the present invention that encodes this knowledge in the knowledge base 608:

```
FOR EACH asset id 'aid' of type 'at' and its location id
'lid' of type 'lt' in point list 'PL' DO
    IF 'at=AC'
    THEN add '{(EMSR1, aid, at), (EMSR2, aid, at)} \
    CoveredFunctions' to 'ExtensibleFunctions'
```

In the present embodiment, Algorithm 4 adds EMSR1 and EMSR2 to the set ExtensibleFunctions for all assets that are not already in the set CoveredFunctions. Specifically, recognizes that EMSR2 can be extended for AC1 and that EMSR1 and EMSR2 can be extended for AC2.

From the new set ExtensibleFunctions (which, in the present embodiment includes the entries {EMSR1,AC1,AC}, {EMSR2,AC1,AC}, {EMSR1,AC2,AC}, {EMSR2,AC2,AC}), AESE 602 is able to compute a justified extensibility score, which is a coverage score that considers the extended elements. In the present embodiment, this computation is performed by using the following Algorithm 5 from knowledge base 608:

```
Compute 'FunctionalExtensibilityScore = ||
union(CoveredFunctions, ExtensibleFunctions)|| / ||
union(CoveredFunctions, NotCoveredFunctions,
CoveredFunctions)||'
```

Algorithm 5 combines the set of covered functions (CoveredFunctions) with the set of extensible functions (ExtensibleFuncitons) in a joined set of functions. Then, Algorithm 5 compares the joined set of functions to the functions that aren't either covered or extensible (NotCoveredFunctions). In the present embodiment, because adding CoveredFunctions and ExtensibleFunctions results in a set that covers the entire functionality of the EMS 604 (that is, functions EMSR1 and EMSR2), the extensibility score is 100%.

In the present embodiment, the extensibility score is based on functional extensibility. However, in other embodiments, it is anticipated that the extensibility score may be based on a wide variety of factors. For example, AESE 602 may calculate the extensibility score based on factors such as data points, assets, and/or locations, and by using knowledge or statistical models collected from other, similar systems, buildings, public data, and/or standards.

Referring back to FIG. 7, the third (and final) step taken by the AESE 602 (see FIG. 6) is to compute the justified EMS 604 impact (step S706). In this step, the sets created in steps S702 and S704 are used to estimate a justified energy impact. For the set of covered functions created in step S702, methods incorporating the time series information from the BMS 606 (see table 900) may be used in this step. However, because the set of extensible functions do not have complete time series data, other methods and data (such as "estimated BMS values") must be used to calculate their respective justified energy impact.

When time series information (see table 900) is available, energy impact can be estimated from historical data (thereby creating an actual contrafactual use value). In the present embodiment, Algorithm 6 is a rule from knowledge base 602 that uses a data mining approach to estimate the energy impact.

```
FOR EACH asset id 'aid' of type 'at' and its location id
'lid' of type 'lt' in point list 'PL' DO
    FOR EACH function type 'ft' in 'CoveredFunctions'
    applicable to 'at' DO
        FOR EACH historical time step 's' in {s1, . . . , sn}
        DO IF function 'ft' in EMS raises no alarm
            THEN add 's' to 'TrainSet'
        Compute 'EnergyModel (lid.aid.CoolingSetpoint,
        lid.RoomTemperature) =
        lid.aid.EnergyMeter (TrainSet)'
    FOR EACH historical time step 's' in {s1, . . . , sn}
    DO IF function 'ft' in EMS raises alarm
        THEN compute 'EnergyImpact (ft, aid) =
        EnergyImpact (ft, aid) +
        lid.aid.EnergyMeter (s) –
        EnergyModel (lid.aid.CoolingSetpoint (s)
        , lid.RoomTemperature (s) )'
```

```
Compute 'EnergyImpact (ft, aid) =
EnergyImpact (ft, aid)/sum (lid.aid.EnergyMeter (s1, . . . , s
n) )'
```

Algorithm 6 evaluates the available historical data for each mapped function. Algorithm 6 first identifies steps in the historical data for which the EMS 604 function did not flag an alarm. Then, Algorithm 6 adds the identified steps to TrainSet. TrainSet is used to train a data mining prediction model, which predicts the energy consumption of the AC with the same room temperature and cooling setpoint. In this example, the energy savings is equal to the difference between the energy consumed when the EMS 604 raises an alarm to the predicted energy without an alarm.

Applying Algorithm 6 to the present embodiment, rule EMSR1 triggers an alarm from time steps 7 through 10 (see table 1000), the time steps during which the cooling actuator (L1_AC1_CoolingActuator) is active and the temperature (L1_Temperature) is lower than the cooling setpoint (L1_AC1_CoolingSetpoint). Using this information, Algorithm 6 looks at the amount of energy consumed (L1_AC1_EnergyMeter) during each of the steps 7 through 10, which is 10 kilowatts (kW) per step. The total amount of energy consumed during these steps is 40 kW (i.e. 10 kW for each of the four steps 7 through 10), which is 57% of the total energy consumption over steps 1 through 10 (70 kW). As such, the resulting energy savings calculated during this step for EMSR1 in the set of covered functions is 57% (the actual contrafactual use value).

Although Algorithm 6 is helpful for EMS 604 rules with existing time series data, when historical data is not available, other methods must be used to estimate energy impact. In the present embodiment, two different types of methods are used: (i) methods using implicit knowledge gained from step S704 (Compute Justified EMS Extensibility); and (ii) methods using explicit knowledge contained in the knowledge base 608.

Algorithm 7 is a method that uses implicit knowledge gained from step S704 to calculate justified EMS 604 impact (or "estimated contrafactual use value") for an extensible function. Specifically, Algorithm 7 uses the energy impact computed for one asset (called the "reference" asset) of a specific asset type and applies it to another asset of the same asset type in the set ExtensibleFunctions:

```
FOR EACH tuple 't1' in 'union (NotCoveredFunctions,
ExtensibleFunctions)' DO
    IF function type 'ft' and asset type 'at' of 't1' is
    used in any tuple 't2' in 'CoveredFunctions'
        THEN set for asset id 'aid1' of 't1' and asset
        id 'aid2' of 't2' the
        'EnergyImpact (ft, aid1) =EnergyImpact (ft, aid2)'
```

In the present embodiment, Algorithm 7 applies the energy impact computed for EMSR1 of AC1 (the reference asset) to AC2, producing an estimated energy impact for AC2 (or the "estimated contrafactual use value").

In cases where there is no reference asset, explicit knowledge about energy impact may be used. Algorithm 8 is an example of a rule that uses explicit knowledge from the knowledge base 608:

```
FOR EACH asset id 'aid' of type 'at' and its location id
'lid' of type 'lt' in point list 'PL' DO
    IF function type 'EMSR1' applicable to 'at' and
    EnergyImpact (EMSR1, aid) =0
        THEN set 'EnergyImpact(EMSR1, aid) =50%'.
    IF function type 'EMSR2' applicable to 'at' and
    EnergyImpact (EMSR2, aid) =0
        THEN set 'EnergyImpact (EMSR2, aid) =20%'.
```

In this example, the default energy impact of EMSR1 and EMSR2 are simply set to 50% and 20%, respectively. This default value may be based on expert knowledge, statistical models, and/or standards, for example. However, other embodiments may set energy impact using a wide variety of factors. For example, AESE 602 may set energy impact based on factors such as room temperature, asset sizes, room sizes, and/or external factors (such as outdoor temperature and occupancy).

Finally, once the estimated energy impact for each rule has been computed (a process which is typically hidden from the user), processing for method 700 completes. The resulting justified EMS energy savings 610 information is then displayed to the user. In many embodiments, the source of the estimate is also indicated (empirical evidence, reference asset-based calculations, and/or explicit knowledge), thereby allowing the user to evaluate the accuracy of the potential energy impact for each rule.

IV. Definitions

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

User/subscriber: includes, but is not necessarily limited to, the following: (i) a single individual human; (ii) an artificial intelligence entity with sufficient intelligence to act as a user or subscriber; and/or (iii) a group of related users or subscribers.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

Building Management System (BMS): controls and monitors a building's appliances, including, for example, appliances relating to heating, cooling, ventilation, lighting, power, fire control, and security (for further examples, see the definition of "Appliance", below). A BMS typically includes both hardware and software, and collects historic and real-time interval data ("BMS information"). Examples of typical BMS information include, but are not limited to: (i) environment-related information, such as temperature, humidity, barometric pressure, and/or weather conditions; (ii) building structural information, such as building size, building layout, and/or thermal properties of the building structure; (iii) occupancy-related information, such as room occupancy and/or presence information; (iv) usage-related information, such as an amount/extent an appliance is used by building occupants, timing of appliance usage, discretionary usage of a particular appliance, and/or data consumption of a particular appliance; (v) setting-related information, such as configuration information or whether an appliance is "on" or "off"; (vi) setpoints, control strategies, and schedules, such as temperature setpoints; and/or (vii) energy-related information, such as the amount, rate, and/or type (electricity, gas, water) of energy consumed.

Energy Management System (EMS): a system of computer-aided tools used to monitor, control, and optimize the performance of the BMS, often for the purpose of reducing energy cost and/or consumption. Examples of typical EMS functions include, but are not limited to: verifying energy data, benchmarking, setting energy use reduction targets, trend analysis, tracking energy consumption, detecting energy wastage or abnormal energy use, diagnosing energy wastage or abnormal energy use, and/or identifying energy-saving (and cost-saving) opportunities.

Building: any type of structure whose energy is susceptible to management by a BMS and/or EMS. Examples of buildings include, but are not limited, to the following: (i) buildings with a single room; (ii) buildings with multiple rooms, hallways, floors, entryways, doors, staircases and/or elevators; (iii) office buildings; (iv) retail/commercial buildings; (v) residential buildings; (vi) industrial buildings (such as factories); (vii) data centers; (viii) airports; (ix) schools, (x) residential buildings (i.e. homes); (xi) sets of buildings, with each building in each set of buildings having its own unique configuration; and/or (xii) virtual and/or simulated buildings.

Appliance: any hardware and/or software (located in a building) that is susceptible to control, monitoring, and/or management by a BMS and/or EMS. Examples of appliances include, but are not limited to: (i) lighting-related appliances, such as lights and shades; (ii) heating/cooling/ventilation-related appliances, such as heaters, coolers, humidifiers, ventilators, and pumps; (iii) ingress/egress-related appliances, such as doors, windows, and window coverings (such as sunblinds); (iv) security-related appliances, such as power-operated security systems, fire systems, and locks; (v) kitchen-related appliances, such as refrigerators, microwaves, and coffee machines; (vi) connectivity-related appliances, such as phones, modems, routers, and computers; (vii) industrial appliances, such as assembly lines and packaging equipment; (viii) cleaning-related appliances, such as washers and dryers; and/or (ix) other building-specific appliances, such as elevators.

What is claimed is:

1. A method comprising:

receiving first actual building management system (BMS) information relating to operation of a first set of appliance(s) located in a first building during a first time interval;

selecting a first proposed energy management system (EMS) rule set, wherein the selecting of the first proposed EMS rule set includes determining, by a machine-logic-based knowledge base, a first applicable EMS rule set, wherein each applicable EMS rule of the first applicable EMS rule set relates to at least one first type of BMS information that is detected by a first type of BMS equipment that is installed in the first building, and wherein the selecting of the first proposed EMS rule set further includes determining, by the machine-logic-based knowledge base, a first extensible EMS rule set, wherein each extensible EMS rule of the first extensible EMS rule set relates to at least one second type of BMS information that is detected by a second type of BMS equipment that could be installed in the first building, but is not installed in the first building; and determining a first contrafactual use value based, at least in part, on the first actual BMS information, wherein the first contrafactual use value corresponds to an amount of one or more energy resources that would have been consumed by the first set of appliance(s) if the BMS had operated the first set of appliance(s) under control of the first proposed EMS rule set, wherein the determining of the first contrafactual use value includes estimating, by the machine-logic-based knowledge base, first estimated BMS values, wherein the determining of the first contrafactual use value depends in part upon the first estimated BMS values, and wherein the first contrafactual use value is an estimated value due to the use of estimated BMS values in the determination of the first contrafactual use value.

2. The method of claim 1 wherein:

the estimated BMS values relate to at least one of the following types of BMS information: asset type, data point type, weather conditions, building size, building structural features, thermal properties of the building's structure, room temperature, room humidity, room barometric pressure, building occupancy, room occupancy, on/off status of the first set of appliance(s), settings status of the first set of appliance(s), energy usage rate(s) of the first set of appliance(s), extent of discretionary use of the first set of appliance(s) by building occupants, timing of discretionary use of the first set of appliance(s) by building occupants, and/or data consumption by the first set of appliance(s).

3. The method of claim 1 further comprising:

identifying BMS equipment that is required to perform under the first proposed EMS rule set.

4. The method of claim 1 wherein:

the knowledge base estimates the first estimated BMS values based on at least one of the following: historical data for the first building, historical data for buildings other than the first building, a computer simulation of building behavior, use of physics-related mathematical equations, use of statistics-related mathematical equations, observational data, and/or pre- programmed knowledge.

5. The method of claim 1 wherein:

the first set of appliance(s) include at least one of the following appliance types: lights, light shades, heaters, coolers, ventilators, humidifiers, doors, windows, window coverings, locks, fans, pumps, power-operated security systems, elevators, fire systems, refrigerators, microwaves, coffee machines, computers, phones, modems, routers, washers, dryers, and/or industrial equipment.

6. The method of claim 1 wherein:
the first contrafactual use value is expressed in terms of at least one of the following: energy units, carbon credits, and/or money.

7. The method of claim 1 further comprising:
receiving a first actual use value corresponding to energy actually used by the first set of appliance(s) during the first time interval; and
determining a difference between: (i) the first actual use value, and (ii) the first contrafactual use value.

8. The method of claim 7 further comprising:
communicating the difference to a potential customer of BMS and/or EMS products.

9. A computer program product comprising a computer readable storage medium having stored thereon:
program instructions programmed to receive first actual building management system (BMS) information relating to operation of a first set of appliance(s) located in a first building during a first time interval;
program instructions programmed to select a first proposed energy management system (EMS) rule set, wherein the selecting of the first proposed EMS rule set includes determining, by a machine-logic-based knowledge base, a first applicable EMS rule set, wherein each applicable EMS rule of the first applicable EMS rule set relates to at least one first type of BMS information that is detected by a first type of BMS equipment that is installed in the first building, and wherein the selecting of the first proposed EMS rule set further includes determining, by the machine-logic-based knowledge base, a first extensible EMS rule set, wherein each extensible EMS rule of the first extensible EMS rule set relates to at least one second type of BMS information that is detected by a second type of BMS equipment that could be installed in the first building, but is not installed in the first building; and
program instructions programmed to determine a first contrafactual use value based, at least in part, on the first actual BMS information, wherein the first contrafactual use value corresponds to an amount of one or more energy resources that would have been consumed by the first set of appliance(s) if the BMS had operated the first set of appliance(s) under control of the first proposed EMS rule set, wherein the determining of the first contrafactual use value includes estimating, by the machine-logic-based knowledge base, first estimated BMS values, wherein the determining of the first contrafactual use value depends in part upon the first estimated BMS values, and wherein the first contrafactual use value is an estimated value due to the use of estimated BMS values in the determination of the first contrafactual use value.

10. The computer program product of claim 9 further comprising:
program instructions programmed to receive a first actual use value corresponding to energy actually used by the first set of appliance(s) during the first time interval; and
program instructions programmed to determine a difference between: (i) the first actual use value, and (ii) the first contrafactual use value.

11. The computer program product of claim 10 further comprising:
program instructions programmed to communicate the difference to a potential customer of BMS and/or EMS products.

12. A computer system comprising:
a processor(s) set; and
a computer readable storage medium;
wherein:
the processor set is structured, located, connected and/or programmed to run program instructions stored on the computer readable storage medium; and
the program instructions include:
program instructions programmed to receive first actual building management system (BMS) information relating to operation of a first set of appliance(s) located in a first building during a first time interval;
program instructions programmed to select a first proposed energy management system (EMS) rule set, wherein the selecting of the first proposed EMS rule set includes determining, by a machine-logic-based knowledge base, a first applicable EMS rule set, wherein each applicable EMS rule of the first applicable EMS rule set relates to at least one first type of BMS information that is detected by a first type of BMS equipment that is installed in the first building, and wherein the selecting of the first proposed EMS rule set further includes determining, by the machine-logic-based knowledge base, a first extensible EMS rule set, wherein each extensible EMS rule of the first extensible EMS rule set relates to at least one second type of BMS information that is detected by a second type of BMS equipment that could be installed in the first building, but is not installed in the first building; and
program instructions programmed to determine a first contrafactual use value based, at least in part, on the first actual BMS information, wherein the first contrafactual use value corresponds to an amount of one or more energy resources that would have been consumed by the first set of appliance(s) if the BMS had operated the first set of appliance(s) under control of the first proposed EMS rule set, wherein the determining of the first contrafactual use value includes estimating, by the machine-logic-based knowledge base, first estimated BMS values, wherein the determining of the first contrafactual use value depends in part upon the first estimated BMS values, and wherein the first contrafactual use value is an estimated value due to the use of estimated BMS values in the determination of the first contrafactual use value.

13. The computer system of claim 12 further comprising:
program instructions programmed to receive a first actual use value corresponding to energy actually used by the first set of appliance(s) during the first time interval; and
program instructions programmed to determine a difference between: (i) the first actual use value, and (ii) the first contrafactual use value.

14. The computer system of claim 13 further comprising:
program instructions programmed to communicate the difference to a potential customer of BMS and/or EMS products.

* * * * *